(12) United States Patent
Yagi et al.

(10) Patent No.: US 7,273,268 B2
(45) Date of Patent: Sep. 25, 2007

(54) PIEZOELECTRIC DEVICE, LIQUID DROPLET DISCHARGING HEAD USING THE DEVICE, AND LIQUID DROPLET DISCHARGING APPARATUS USING THE HEAD

(75) Inventors: Takashi Yagi, Kanagawa (JP); Shinji Seto, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 241 days.

(21) Appl. No.: 10/887,335

(22) Filed: Jul. 9, 2004

(65) Prior Publication Data

US 2005/0052506 A1    Mar. 10, 2005

(30) Foreign Application Priority Data

Jul. 11, 2003   (JP) .............................. 2003-195741

(51) Int. Cl.
*B41J 2/045*   (2006.01)
(52) U.S. Cl. ...................................................... 347/72
(58) Field of Classification Search ................. 347/68, 347/70–72; 29/25.35
See application file for complete search history.

(56) References Cited

U.S. PATENT DOCUMENTS 6,494,567 B2 *  12/2002  Murai .......................... 347/71
6,929,355 B2 *  8/2005  Matsuzawa .................. 347/71
7,008,048 B2 *  3/2006  Sakaida ........................ 347/68

FOREIGN PATENT DOCUMENTS

| JP | A-11-157070 | 6/1999 |
| JP | A-2001-11-334062 | 12/1999 |
| JP | B-3019845 | 1/2000 |
| JP | A-2001-88296 | 4/2001 |
| JP | A-2001-210888 | 8/2001 |

* cited by examiner

*Primary Examiner*—An H. Do
(74) *Attorney, Agent, or Firm*—Morgan, Lewis & Bockius LLP

(57) ABSTRACT

A piezoelectric device includes a piezoelectric body layer, a first electrode layer at one face side of the piezoelectric body layer, and a second electrode layer at a side of a face of the same that is opposite to the side at which the first electrode layer is disposed. Higher potentials are applied to the first electrode layer and lower potentials are applied to the second electrode layer. The piezoelectric device features a metallic layer disposed in contact with a piezoelectric body layer surface at the side at which the first electrode layer is provided, and a metal oxide layer disposed in contact with a piezoelectric body layer surface at the side at which the second electrode layer is provided. The metallic layer is formed of a metallic material with a standard electrode potential greater than 0 V, and the metal oxide layer is formed of a metal oxide.

16 Claims, 4 Drawing Sheets

PIEZOELECTRIC DEVICE, LIQUID DROPLET DISCHARGING HEAD USING THE DEVICE, AND LIQUID DROPLET DISCHARGING APPARATUS USING THE HEAD

CROSS-REFERENCE TO RELATED APPLICATION

This application claims priority under 35 USC 119 from Japanese Patent Application No. 2003-195741, the disclosure of which is incorporated by reference herein.

BACKGROUND OF THE INVENTION

1. Field of the Invention

The present invention relates to a piezoelectric device, a liquid droplet discharging head which uses the device, and a liquid droplet discharging apparatus which uses the liquid droplet discharging head. The present invention more particularly relates to a piezoelectric device for discharging liquid droplets to record text, images and the like on recording media and/or for implementing formation of fine-detail patterns and thin films and the like on substrates, and to a liquid droplet discharging head which uses this device and a liquid droplet discharging apparatus which uses the liquid droplet discharging head.

2. Description of the Related Art

A liquid droplet discharging head which uses pressure-generating means, such as a piezoelectric actuator or the like, to generate a pressure wave (a sound wave) in a liquid filling a pressure generation chamber and discharge liquid droplets from a nozzle, which is communicated with the pressure generation chamber (or a pressure chamber), with this pressure wave is generally well known. Generally, a piezoelectric actuator is structured by a piezoelectric device (a piezo element), which is deformed in accordance with image information, and an oscillating diaphragm, which is oscillated by the deformation of the piezoelectric device and causes the pressure generation chamber to expand and contract.

For a piezoelectric device, one example of a piezoelectric body and structure of electrode materials thereof is a piezoelectric device which is structured by forming, at front and rear faces of a piezoelectric body, a first electrode layer and a second electrode layer such that the piezoelectric device is constituted of the first electrode layer (gold/nickel/chromium), the layer of the piezoelectric body, and the second electrode layer (chromium/gold). When application of voltages and continuous driving are applied to a piezoelectric device with such a structure in an environment with the room temperature and the room humidity and in an environment with high temperature and high humidity, defects such as the electrodes discoloring to brown, the electrodes peeling off, and piezoelectric characteristics deteriorating may occur. From the results of investigations of these defects, it has been found that:

(1) these defects tend to occur particularly often in high humidity environments;

(2) portions that have turned brown are the respective oxides of chromium and nickel; and (3) the same defects occur when moisture adheres to exposed portions of the cross-section of the piezoelectric body and electrode layers.

Thus, it has been determined that these defect phenomena are caused by the progression of electrochemical reactions due to the application of electric fields in the presence of moisture.

Specifically, it is assumed that local cells are formed in vicinities of the piezoelectric body during driving with high-strength electric fields in the presence of moisture, pH changes occur due to localized electrolysis of the moisture, a material that is susceptible to elution in accordance with pH value or a material that is susceptible to electrochemical corrosion (among the materials mentioned above, chromium) is eluted before other materials, and defects in the form of electrode color changes and deterioration of piezoelectric characteristics occur.

In order to suppress these phenomena, use of, for example, films of oxides of metals which are electrochemically stable over a broad pH range, specifically tin oxide, as electrode materials has been considered. For example, Japanese Patent Application Laid-Open (JP-A) No. 2001-88296 describes a piezoelectric device $9b$ in which electrodes structured by laminated films of a conductive oxide layer 93 and a metallic layer 92 are formed at both faces of a piezoelectric body 91 (see FIG. 4). With this structure, negative ions, including lead, which are generated in the piezoelectric body 91 are prevented from passing through the electrodes and migrating to the electrode surfaces, and the occurrence of discoloration/staining of the electrode surfaces, lifting of the electrodes and the like is eliminated. The reference states that thus, even if the piezoelectric body 91 is made thinner and is used with high electric field strengths in a high temperature, high humidity environment, the piezoelectric device $9b$ can be provided with sufficient reliability and durability.

However, with this piezoelectric device $9b$, sufficient durability is lost, particularly in high humidity or under condensation, because of the conductivity of the conductive oxide layer 93. That is, when high-strength electric fields are applied in the presence of moisture (for example, in air, where moisture is always present), electrolysis of water occurs locally and there are changes in local pH values. As a result, even with a conductive oxide film which exhibits more metal-like behavior, in which conductivity is maintained and conduction carriers are accordingly more numerous, piezoelectric characteristics may be caused to deteriorate over time by the progression of the electrochemical reaction described above.

Further, for a liquid droplet discharging head that uses a piezoelectric device, various investigations besides those mentioned above have been carried out.

Examples include: a technology for maintaining stable piezoelectric characteristics over time by preventing reductions in piezoelectric device leakage currents and drops in driving voltage, by providing a layer formed of an $ABO_3$-type compound in which a Pb-inclusion amount is suppressed on at least one face of a piezoelectric body film (see JP-A-No. 2001-210888); a technology for preventing short-circuits between upper and lower electrodes, which are provided in contact with a piezoelectric film, and falls in insulation when humidity rises (see JP-A No. 11-334062); a technology for using a compressive film as a resilient film and reducing initial warping (see the specification of Japanese Patent No. 3019845); a technology which improves displacement characteristics and reliability (JP-A No. 11-157070); and the like. Even with liquid droplet discharging heads that employ these technologies, piezoelectric characteristics may deteriorate over time in a manner similar to that described above.

SUMMARY OF THE INVENTION

The present invention has been devised in order to solve the problems described above. That is, the present invention provides a highly reliable piezoelectric device, a liquid droplet discharging head using this device and a liquid droplet discharging apparatus using the liquid droplet discharging head, in which, even if the liquid droplet discharging head is continuously used over a long period in high temperature and high humidity, deterioration over time of piezoelectric characteristics of the piezoelectric device of the liquid droplet discharging head can be avoided.

In order to achieve the object described above, the present inventors have carried out concentrated investigations into deteriorations over time of piezoelectric characteristics of piezoelectric devices that are employed in liquid droplet discharging heads. Below, structure of a side of a piezoelectric device to which a higher potential is applied and structure of a side to which a lower potential is applied are respectively separately described.

—Higher Potential Application Side—

First, the present inventors performed continuous driving of a piezoelectric device having a typical structure as described earlier: a first electrode layer (gold/nickel/chromium)/a piezoelectric body layer/and a second electrode layer (chromium/gold). Hence, it has been confirmed that, particularly in high temperature, high humidity environments, electrochemical reactions progress in vicinities of the piezoelectric device (particularly vicinities of exposed cross-sections) due to local cell formation caused by the electrolysis of water, local pH variations and the like, and portions of the electrode materials are ionized and eluted, which is consequentially related to electrode color changes, electrode peeling and piezoelectric characteristic deterioration.

Further, it has been confirmed that even with a structure in which a conductive metal oxide is formed at a positive potential application side (the higher potential application side) as in JP-A No. 2001-88296, as described earlier, environmental resistance, particularly to high temperatures and high humidities, may not be sufficient and piezoelectric characteristics may deteriorate. Given the facts mentioned above, the present inventors consider that it is necessary that a layer provided in contact with the higher potential application side of a piezoelectric body layer is formed from an electrochemically stable metallic material.

—Lower Potential Application Side—

Next, with a piezoelectric device in which a layer in contact with a higher potential side of a piezoelectric body layer is a metal oxide and a layer in contact with a lower potential side of the piezoelectric body layer is formed of the metal oxide, as mentioned earlier, the present inventors drove this piezoelectric device with a high-strength electric field over a long period until piezoelectric characteristics significantly deteriorated, and then tried implementing driving with application of an opposite electric field. From the results, it has been confirmed that although an initial electrostatic capacitance before performing driving with application of the electric field in the regular direction was not recovered, it was possible to recover up to around 70 to 90% of the original electrostatic capacitance.

Further, it has been confirmed that for a case in which this test is performed in a high temperature, high humidity environment, the above-mentioned deterioration of piezoelectric characteristics, at the time of applying the electric field in the regular direction, and recovery of electrostatic characteristics, when applying the opposite electric field, were even more remarkable.

Now, it is generally known that the "fatigue effect" occurs when a piezoelectric device is driven with high electric fields for long periods. There are various theories about the causes of this phenomenon, and a definitive explanation has not been provided. However, among these theories, there is a theory that oxygen holes (positive charge carriers) accumulate at a boundary portion between an electrode and a piezoelectric body and form a low conductivity layer.

The deterioration and recovery of piezoelectric characteristics in the above-described experiments by the present inventors support the above-mentioned oxygen hole theory. Therefore, the present inventors consider that a metallic layer provided in contact with a lower potential side of a piezoelectric body layer will be susceptible to the accumulation of oxygen holes, which have migrated to the lower potential side of the piezoelectric body layer, in the vicinity of a boundary between the piezoelectric body layer and the metallic layer.

Further, given that the deterioration and recovery accelerate in high temperature and high humidity, it is considered that temperature and humidity affect the amount of oxygen holes generated, and it is conjectured that as long as a piezoelectric device is used in air, in which moisture is unavoidably present, the fact of generation of oxygen holes in a piezoelectric body layer is basically unavoidable.

In order to prevent deterioration over time of a piezoelectric device which is caused at the lower potential side, it is considered that it is important to eliminate oxygen holes, which are thought to be generated in the piezoelectric body layer by electric fields and accumulated at the lower potential side of the piezoelectric body layer, by supplying oxygen from outside. Accordingly, the present inventors consider that it is necessary to provide a metal oxide layer at a layer in contact with the lower potential side of the piezoelectric body layer, to serve as an oxygen supply source for eliminating these oxygen holes.

The present inventors have devised the present invention as follows on the basis of the investigations relating to deteriorations over time of piezoelectric characteristics at the higher potential application side and lower potential application side of a piezoelectric device as described above. Specifically, the present invention provides a piezoelectric device having the characteristics of the following items <1> to <7>, a liquid droplet discharge head having the characteristics of items <8> to <15>, and a liquid droplet discharge apparatus having the characteristics of item <16>.

<1> A piezoelectric device including: a piezoelectric body layer; a first electrode layer disposed at a side of one face of the piezoelectric body layer, at which first electrode layer a higher potential is to be applied; and a second electrode layer disposed at a side of a face of the piezoelectric body layer that is opposite to the side thereof at which the first electrode layer is disposed, at which second electrode layer a lower potential is to be applied, the piezoelectric device comprising:

a metallic layer is provided in contact with the face of the piezoelectric body layer at the side thereof at which the first electrode layer is disposed, the metallic layer being formed of a metallic material with a standard electrode potential greater than 0 V; and a metal oxide layer is provided in contact with the face of the piezoelectric body layer at the side thereof at which the second electrode layer is disposed, the metal oxide layer being formed of a metal oxide.

<2> The piezoelectric device described in <1>, wherein the metallic material includes at least one metallic element selected from Ir, Au, Pt, Ru, Pd, Rh, Re, Ag and Cu.

<3> The piezoelectric device described in <1>, wherein the metallic layer includes a thickness in the range of 50 nm to 1 μm.

<4> The piezoelectric device described in <1>, wherein the metal oxide includes at least one metallic element selected from Ir, Sn, Ru, Re, Rh, Pd, Sr, In, Ti, Zr, Nb, Mg, Si, Ta, Al, Zn, Mn, Co, Os and Hf.

<5> The piezoelectric device described in <1>, wherein the metal oxide layer includes a thickness in the range of 50 nm to 1 μm.

<6> The piezoelectric device described in <1>, wherein the first electrode layer has a structure formed of three layer which include the metal layer, in which structure the metallic layer, a layer containing Ni and a layer containing Au are laminated in this order from the piezoelectric body layer side.

<7> The piezoelectric device described in <1>, wherein the piezoelectric device includes an end face, and at least a portion of the end face is exposed.

<8> A liquid droplet discharging head comprising:
a pressure generation chamber which is filled with liquid;
a nozzle which is in fluid communication with the pressure generation chamber and which is capable of discharging a liquid droplet; and
an actuator which includes at least an oscillating diaphragm which structures at least a portion of a wall face of the pressure generation chamber and which, by oscillating, causes the pressure generation chamber to expand and contract, and a piezoelectric device which, by deforming in accordance with voltages which are applied in accordance with image information, causes the oscillating diaphragm to oscillate,
the piezoelectric device including at least: a piezoelectric body layer; a first electrode layer disposed at a side of one face of the piezoelectric body layer, at which first electrode layer a higher potential is to be applied; and a second electrode layer disposed at a side of a face of the piezoelectric body layer that is opposite to the side thereof at which the first electrode layer is disposed, at which second electrode layer a lower potential is to be applied,
wherein a metallic layer is provided in contact with the face of the piezoelectric body layer at the side thereof at which the first electrode layer is disposed, the metallic layer being formed of a metallic material with a standard electrode potential greater than 0 V, and
a metal oxide layer is provided in contact with the face of the piezoelectric body layer at the side thereof at which the second electrode layer is disposed, the metal oxide layer being formed of a metal oxide.

<9> The liquid droplet discharging head described in <8>, wherein the metallic material includes at least one metallic element selected from Ir, Au, Pt, Ru, Pd, Rh, Re, Ag and Cu.

<10> The liquid droplet discharging head described in <8>, wherein the metallic layer includes a thickness in the range of 50 nm to 1 μm.

<11> The liquid droplet discharging head described in <8>, wherein the metal oxide includes at least one metallic element selected from Ir, Sn, Ru, Re, Rh, Pd, Sr, In, Ti, Zr, Nb, Mg, Si, Ta, Al, Zn, Mn, Co, Os and Hf.

<12> The liquid droplet discharging head described in <8>, wherein the metal oxide layer includes a thickness in the range of 50 nm to 1 μm.

<13> The liquid droplet discharging head described in <8>, wherein the first electrode layer includes a structure formed of three layers which includes the metallic layer, in which structure the metallic layer, a layer including Ni and a layer including Au are laminated in this order from the piezoelectric body layer side.

<14> The liquid droplet discharging head described in <8>, wherein the piezoelectric device includes an end face, and at least a portion of the end face is exposed.

<15> The liquid droplet discharging head described in <8>, wherein a face of the piezoelectric device, at the side thereof at which the second electrode is provided, is disposed in contact with the oscillating diaphragm.

<16> A liquid droplet discharging apparatus at least including a liquid droplet discharging head, the liquid droplet discharging head comprising:
a pressure generation chamber which is filled with liquid;
a nozzle which is in fluid communication with the pressure generation chamber and which is capable of discharging a liquid droplet; and
an actuator which includes at least an oscillating diaphragm which structures at least a portion of a wall face of the pressure generation chamber and which, by oscillating, causes the pressure generation chamber to expand and contract, and a piezoelectric device which, by deforming in accordance with voltages which are applied in accordance with image information, causes the oscillating diaphragm to oscillate,
the piezoelectric device including at least: a piezoelectric body layer; a first electrode layer disposed at a side of one face of the piezoelectric body layer, at which first electrode layer a higher potential is to be applied; and a second electrode layer disposed at a side of a face of the piezoelectric body layer that is opposite to the side thereof at which the first electrode layer is disposed, at which second electrode layer a lower potential is to be applied,
wherein a metallic layer, which is formed of a metallic material with a standard electrode potential greater than 0 V, is provided in contact with the face of the piezoelectric body layer at the side thereof at which the first electrode layer is disposed,
and a metal oxide layer, which is formed of a metal oxide, is provided in contact with the face of the piezoelectric body layer at the side thereof at which the second electrode layer is disposed.

DETAILED DESCRIPTION OF THE INVENTION

Figure 1:
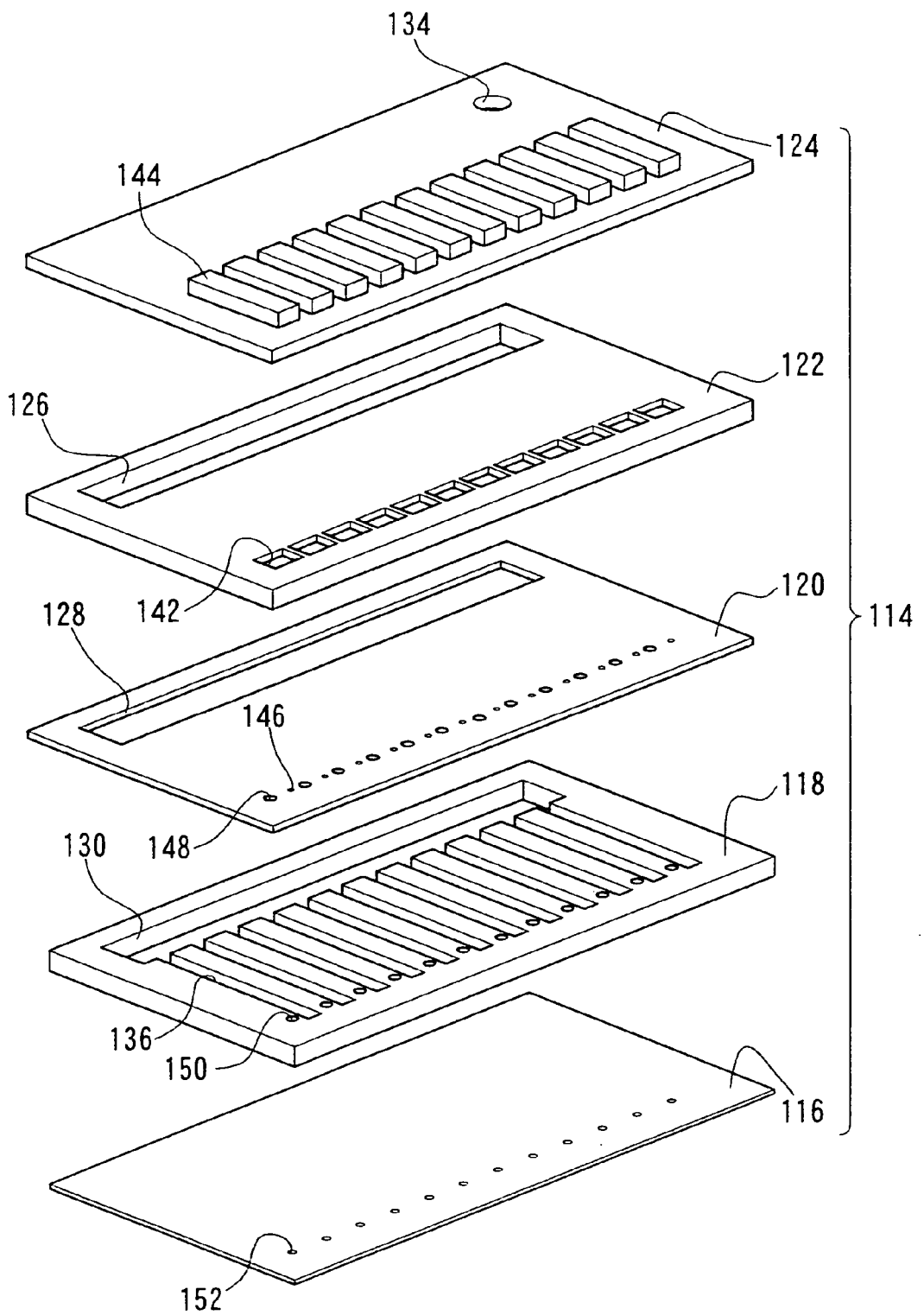
FIG. 1 is a perspective view partially showing a liquid droplet discharge head of an embodiment of the present invention.

Herebelow, the present invention is principally divided into a piezoelectric device, a liquid droplet discharging head and a liquid droplet discharging apparatus, which will be described in that order.

—Piezoelectric Device—

The piezoelectric device of the present invention is a piezoelectric device that includes at least a piezoelectric body layer, a first electrode layer provided at the side of one face of the piezoelectric body layer, and a second electrode layer provided at the side of a face of the piezoelectric body layer that is opposite to the face at which the first electrode layer is provided. Higher potentials are applied to the first electrode layer and lower potentials are applied to the second electrode layer. A metallic layer formed of a metallic material with a standard electrode potential greater than 0 V is provided in contact with a surface of the piezoelectric body layer at the side at which the first electrode layer is provided. A metal oxide layer formed of a metal oxide is provided in contact with a surface of the piezoelectric body layer at the side at which the second electrode layer is provided.

Consequently, even if the piezoelectric device of the present invention is used for long periods in high temperatures and high humidities, deterioration of the piezoelectric device over time will be slight. Therefore, when the piezoelectric device of the present invention is used in a liquid droplet discharging head, even if the head is used for long periods in high temperatures and high humidities, stable liquid droplet discharge characteristics can be maintained over long periods.

Further, it is preferable to use the piezoelectric device of the present invention as a piezoelectric device of a liquid droplet discharging head as is employed in an inkjet-type recording apparatus, as mentioned earlier. However, the piezoelectric device of the present invention is not limited to this, and can be favorably used for other applications that feature a member or apparatus equipped with a piezoelectric device that has the capabilities for use over long periods in high temperatures and high humidities.

Deterioration of piezoelectric characteristics in high temperature, high humidity environments includes, besides deterioration of the electrodes themselves due to moisture as described above, the occurrence of oxygen holes in the piezoelectric body layer. In regard to the generation of these oxygen holes, a major cause thereof is moisture being electrolyzed, the products thereof passing into the piezoelectric body layer in the form of ions and reducing a material that structures the piezoelectric body layer. Further, it is assumed that an electrode reaction in electrode regions in the vicinity of both side faces of the piezoelectric body layer is a major contributor to ionization of moisture that enters into the piezoelectric body layer.

However, in the piezoelectric device of the present invention, the metallic layer provided in contact with the face of the piezoelectric body layer at the higher potential application side thereof is formed of the metallic material whose standard electric potential is larger than 0 V. Consequently, in addition to deterioration of the electrode itself being preventable, ionization due to electrolysis of moisture in the vicinity of the piezoelectric body layer and ingression of the ions into the piezoelectric body layer can be suppressed. As a result, the amount of oxygen holes generated at the piezoelectric body layer itself can be made smaller, which is beneficial.

A further benefit is that even when oxygen holes are generated in the piezoelectric body layer, the holes are eliminated by oxygen, which is supplied from the metal oxide layer provided in contact with the face of the lower potential application side of the piezoelectric body layer.

Further again, because the amount of oxygen holes generated is suppressed as described above, the ability of the metal oxide layer to supply oxygen can be kept stable over longer periods, which is synergistically beneficial.

Thus, in the piezoelectric device of the present invention, in addition to the sum of the contributions of providing the aforementioned metallic layer in contact with the face of the piezoelectric body layer at the higher potential application side thereof and providing the aforementioned metal oxide layer in contact with the face of the piezoelectric body layer at the lower potential application side thereof, the synergistic contribution of these two layers is also effective for suppressing deterioration of piezoelectric characteristics over time in a high temperature, high humidity environment.

In the present invention, the "standard electrode potential" means the value represented by $\Delta V$ in the reaction described by the following formula (1).

$$M^{n+} + ne^- \rightarrow M + \Delta V \qquad \text{Formula (1)}$$

Now, in formula (1), $M^{n+}$ represents a metal ion, M represents a metal atom, n represents an integer of at least 1, $e^-$ represents an electron, and $\Delta V$ represents the standard electrode potential (Volts).

The metallic material for which this standard electrode potential is greater than 0 V is not particularly limited as long as a metallic element unit with a standard electrode potential greater than 0 V or an alloy of such metallic elements is present. Specifically, a material including at least one metallic element selected from Ir, Au, Pt, Ru, Pd, Rh, Re, Ag and Cu is preferable.

In view of resistance to high temperatures when implementing wiring connections, ease of film formation, etc., the use of Ir, Au, Pt or Ag—Pd is preferable.

Thickness of the metallic layer formed with this metallic material is preferably within a range of 50 nm to one μm, and is more preferably within a range of 100 nm to 0.5 μm.

If the thickness of the metallic layer is thinner than 50 nm, it will not be possible to thoroughly suppress water electrolysis in vicinities of the piezoelectric body layer, particularly in high temperatures and high humidities, and this may lead to a deterioration of piezoelectric characteristics over time. On the other hand, if the thickness of the metallic layer is thicker than 1 μm, such a metallic layer may hinder deformation of the piezoelectric device and it may not be possible to guarantee adequate displacement amounts that are required of the piezoelectric device.

Because the metallic layer described above has conductivity, it may itself function as the first electrode layer. Alternatively, the metallic layer may function as a portion of the first electrode layer. In such a case, a layer formed of another conductive material can be laminated on a face of the metallic layer at the side thereof that is opposite to the side thereof at which the piezoelectric body layer is disposed.

In the latter case, it is preferable that the first electrode layer is formed by three layers including the metallic layer, having a structure in which the metallic layer, a layer containing Ni and a layer containing Au are laminated in this order from the piezoelectric body layer side. When the first electrode layer is provided with this three-layer structure, wiring connections to the piezoelectric device can be implemented with ease during production of the liquid droplet discharge head that uses the piezoelectric device of the present invention.

Meanwhile, the metal oxide which structures the metal oxide layer is not particularly limited as long as a known metallic oxide is present. It is preferable that the metallic oxide is a metal oxide including at least one metallic element selected from Ir, Sn, Ru, Re, Rh, Pd, Sr, In, Ti, Zr, Nb, Mg, Si, Ta, Al, Zn, Mn, Co, Os and Hf.

Among such metal oxides, metal oxides including Ir, Ru or Sn are preferable in view of enabling greater capabilities of oxygen supply to the piezoelectric body layer. Examples include $Ir_2O_3$, $IrO_2$, $RuO_2$, $SnO_2$, SnO and so forth.

Ir and the like can function as catalysts for the generation of hydrogen, which reduces the piezoelectric body layer and causes deterioration. Therefore, when a metal oxide including such a metallic element is to be used, appropriate use is possible subject to consideration of the combination thereof with the metallic layer selected for the higher potential side.

Thickness of the metal oxide layer formed with this metal oxide is preferably within a range of 50 nm to 1 μm, and is more preferably within a range of 100 nm to 0.5 μm.

If the thickness of the metal oxide layer is thinner than 50 nm, oxygen holes may accumulate at the second electrode layer side of the piezoelectric device, particularly in high temperatures and high humidities, and this may lead to a deterioration of piezoelectric characteristics over time. On the other hand, if the thickness of the metallic layer is thicker than 1 μm, such a metal oxide layer may hinder deformation of the piezoelectric device and it may be not possible to guarantee adequate displacement amounts that are required of the piezoelectric device.

Conductivity of this metal oxide layer is not particularly limited. However, in a case in which the layer has conductivity, the metal oxide layer may function as the whole or a portion of the second electrode. On the other hand, in a case in which the metal oxide layer is non-conductive, the second electrode layer, which is formed with a conductive material such as a known metal or conductive metal oxide or the like, is provided at a face of this metal oxide layer at the side thereof that is opposite to the side thereof at which the piezoelectric body layer is disposed.

In the piezoelectric device of the present invention, the piezoelectric body layer is not particularly limited as long as the piezoelectric device can deform in the thickness direction of the piezoelectric body layer when a voltage is applied, the whole face of the higher potential application side of the piezoelectric body layer is substantially covered with the metallic layer described above, and the whole face of the lower potential application side of the piezoelectric body layer is substantially covered with the metal oxide layer described above. However, as the form of the piezoelectric body layer, a flat plate form having end faces provided such that lateral and longitudinal positions of each layer structuring the piezoelectric device are aligned is generally used.

In such a case, it is preferable that end faces of the piezoelectric device are exposed. The end faces being exposed means a state in which the surfaces of end face portions of at least the first electrode layer, the metallic layer, the piezoelectric body layer, the metal oxide layer and the second electrode layer are not provided with any protective layer, and materials structuring these layers are stripped out. Here, in view of making structure of the piezoelectric device simpler and enabling relative simplification of production processes thereof, it is preferable that all end faces of the piezoelectric device are exposed.

Even when the end faces of the piezoelectric device of the present invention are exposed as described above, the capability of suppressing electrochemical reactions at the higher potential application side is high, and the accumulation of oxygen holes in the piezoelectric body layer at the lower potential application side can be suppressed. Therefore, in comparison with conventional piezoelectric devices, deterioration over time of piezoelectric characteristics can be sufficiently suppressed even without the end face portions being protected from the air. Of course, a protective layer (for example, an inorganic film of silicon oxide, silicon nitride or the like, or an organic film of polyimide, parylene or the like), particularly a layer with high capability for blocking moisture in the atmosphere, may be provided at end face portions so as to enable further suppression of piezoelectric characteristic deterioration with time over long periods and to provide resistance even to use in more unfavorable high temperature, high humidity environments.

Next, the piezoelectric body layer structuring the piezoelectric device of the present invention will be described. A material structuring the piezoelectric body layer is not particularly limited as long as a known piezoelectric body material, which can deform when a voltage is applied, is present. For example, in a piezoelectric device to be used for liquid droplet discharge, in view of the characteristics that are required therefor, it is preferable to use a piezoelectric body of a lead zirconate titanate (PZT) type, which has a relatively high piezoelectric constant. In particular, denatured-PZT to which a donor (for example, Nb or the like) has been added has a large piezoelectric coefficient and is favorable for liquid droplet discharge applications. However, with regard to environmental resistance, donor-doped PZT deteriorates greatly over time. Thus, the effects of application of the present invention are significant in denatured-PZT.

Thickness of the piezoelectric body layer is not particularly limited but, in practice, is preferably in the range of 1 μm to 50 μm.

A method of production of the piezoelectric device of the present invention is not particularly limited, and it may be manufactured in the same manner as conventional piezoelectric devices. For example, it is possible to machine a plate formed of the piezoelectric body material to a desired thickness beforehand, and form the material structuring the metallic layer described above at one face of the plate by using a known film formation process such as, for example, a vapor phase film formation process such as a sputtering process, a vapor deposition process or the like. Further, in a case in which the first electrode layer has a structure with two or more layers, including the metallic layer, further conductive materials may be formed at the surface of the metallic layer using known film formation processes.

It is further possible to form the metal oxide at the other face of the piezoelectric body material using a known film formation process such as a vapor phase film formation process including a sputtering process, a CVD process or the like or a liquid phase film formation process including a sol-gel process or the like. Further, in a case in which a layer structuring the second electrode is to be formed at the surface of the metal oxide layer, a known conductive material such as a metal, a conductive metal oxide or the like can be formed using a known film formation process.

A large plate-form piezoelectric body device produced in this manner can be used in production of a liquid droplet discharge head or the like by being machined to a desired size with a known machining process such as a dicing process, a blasting process or the like.

Alternatively, in a case in which the piezoelectric body device of the present invention is to be used specifically for production of a liquid droplet discharging head including an oscillating diaphragm, it is possible to laminate each layer structuring the piezoelectric body device on a base plate which will serve as the oscillating diaphragm by sequential film formation, using liquid phase film formation processes and/or vapor phase film formation processes, as illustrated above, to form the piezoelectric body device.

Now, in the metal oxide layer, it is preferable that the oxygen atoms structuring this layer are in a state in which there is no stoichiometric excess or shortfall thereof relative to the metal atoms, or tend to the side of excess. If the oxygen atoms structuring the metal oxide layer are stoichiometrically on the side of scarcity relative to the metal atoms, it may not be possible to supply sufficient oxygen to the piezoelectric body layer.

Therefore, if the metal oxide layer is formed by, for example, forming a coating film using a liquid phase film formation process such as a sol-gel process or the like and then sintering this coating film, it is preferable to carry out the sintering of the coating film in an oxygen atmosphere.

Alternatively, if the metal oxide layer is formed using a sputtering process, film formation in a gas atmosphere in which oxygen gas is added to argon gas and, after the film formation, annealing of the thus formed metal oxide layer in an oxygen atmosphere is preferable.

Further, if a metal oxide target is to be used, this target could be thoroughly annealed in an oxygen atmosphere beforehand.

—Liquid Droplet Discharging Head and Liquid Droplet Discharging Apparatus Using the Head—

Next, the liquid droplet discharging head and the liquid droplet discharging apparatus that uses the same will be described. The liquid droplet discharging head of the present invention is not particularly limited as long as it is capable of discharging liquid droplets from a nozzle using the piezoelectric device of the present invention. However, a head having the following specific structure is preferable.

That is, the liquid droplet discharging head of the present invention is preferably a head which includes a pressure generation chamber, a nozzle capable of discharging liquid droplets, an oscillating diaphragm and an actuator. Here, the pressure generation chamber is filled with liquid, the nozzle is in fluid communication with the pressure generation chamber, and the oscillating diaphragm expands and compresses the pressure generation chamber by oscillating. The actuator is provided at least with the piezoelectric device, which causes the oscillating diaphragm to oscillate by deforming in accordance with voltages, which are applied in accordance with image information.

The liquid droplet discharging apparatus of the present invention is also not particularly limited as long as it is provided at least with the liquid droplet discharging head of the present invention.

Below, a specific example of the liquid droplet discharging head of the present invention will be described using the drawings.

Figure 2:
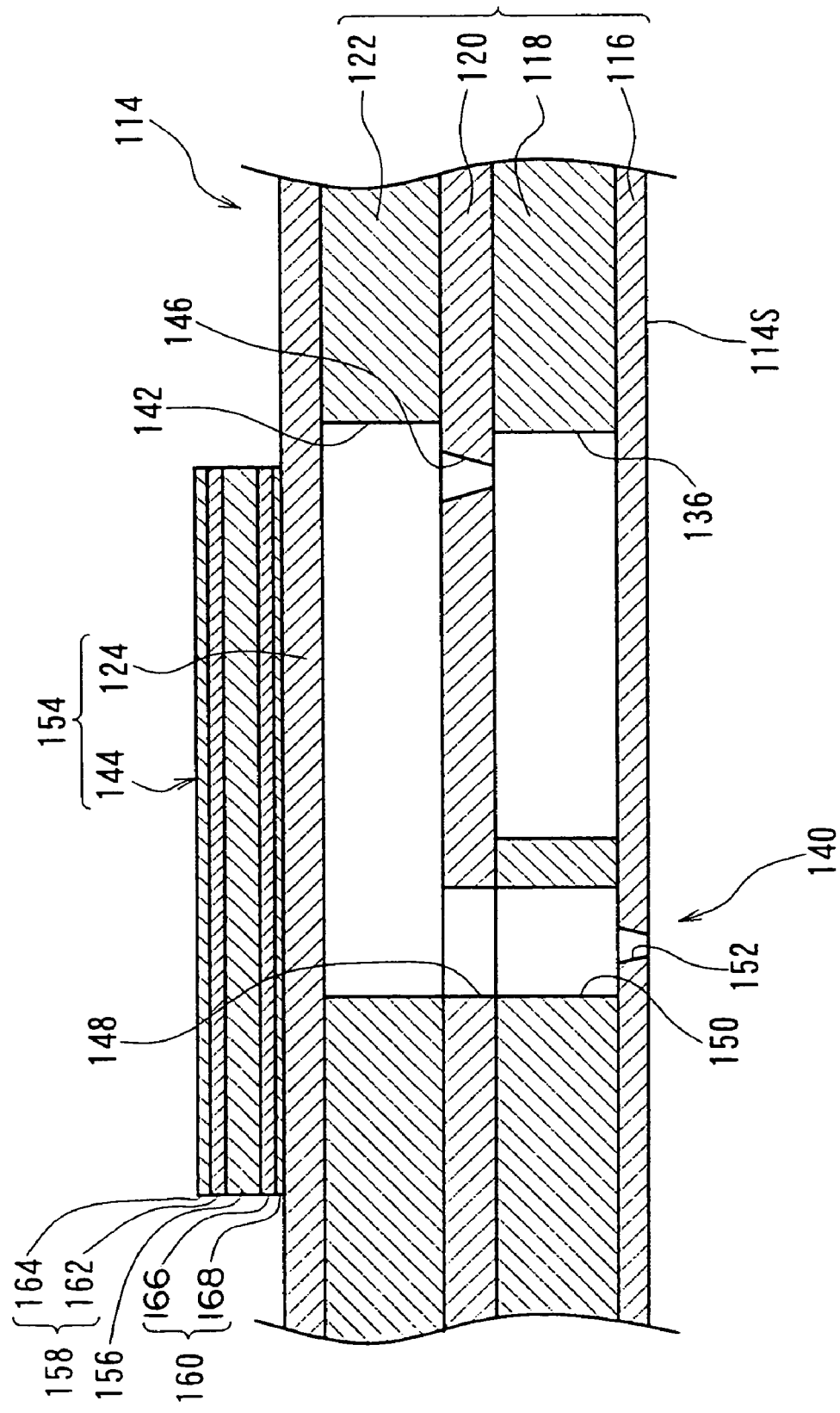
FIG. 2 is a sectional view partially showing the liquid droplet discharge head of the embodiment of the present invention.
Figure 3:
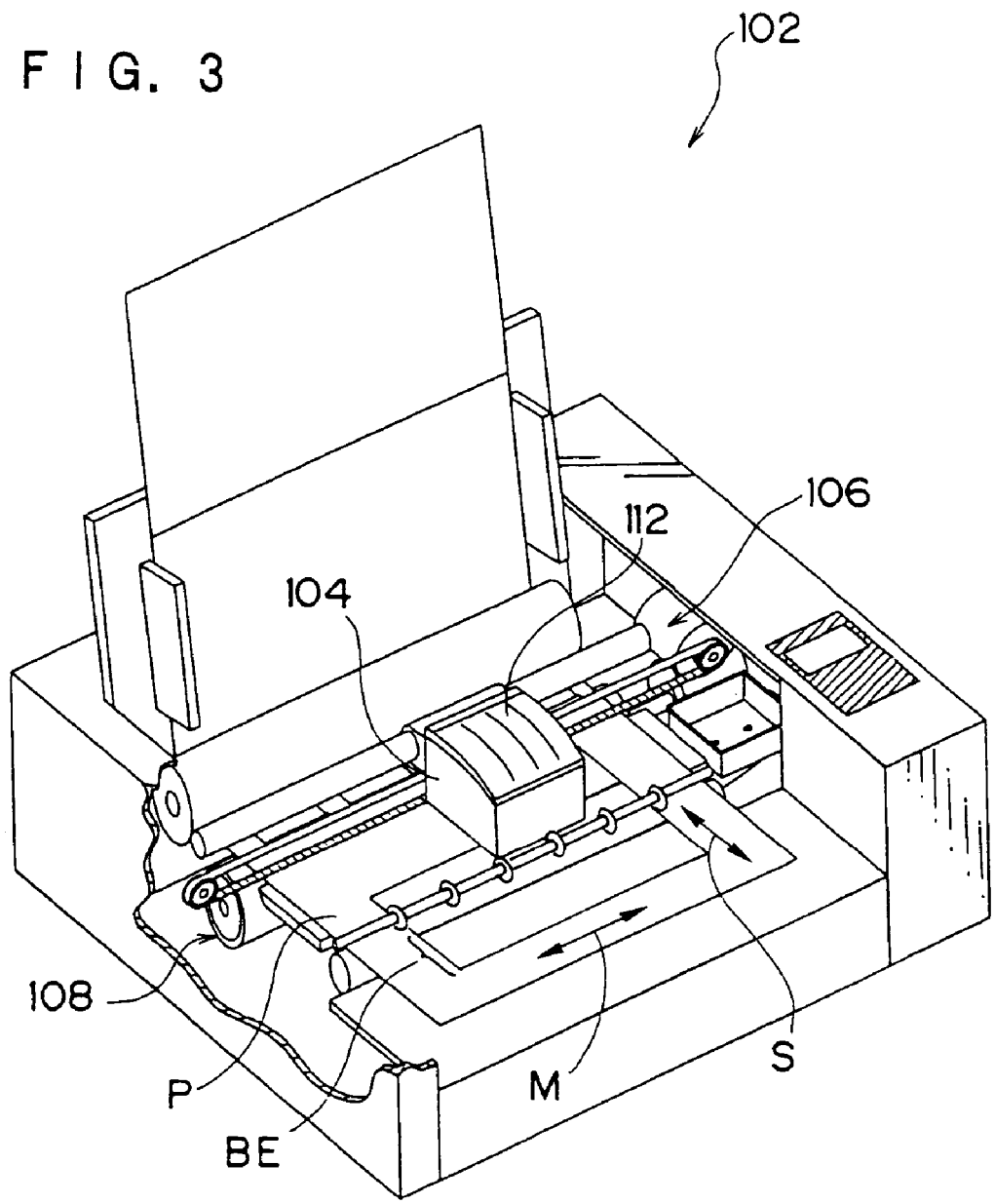
FIG. 3 is a perspective view showing a liquid droplet discharge apparatus of the embodiment of the present invention.
Figure 4:
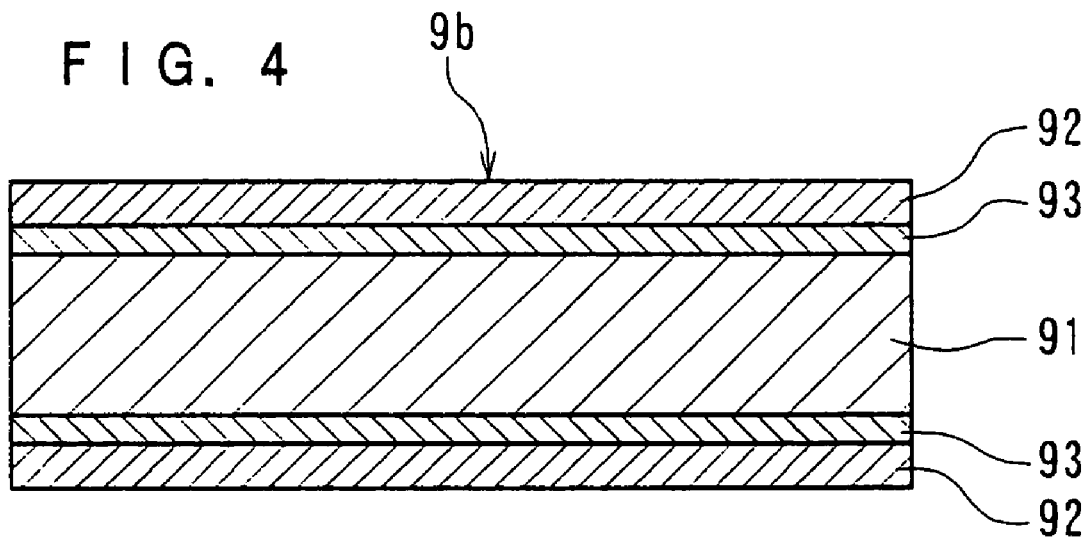
FIG. 4 is a sectional view showing structure of a piezoelectric device of a conventional inkjet recording head.

FIG. 1 is a perspective view showing a portion of a liquid droplet discharging head of an embodiment of the present invention. FIG. 2 is a sectional view showing a portion of the liquid droplet discharging head of the embodiment of the present invention (as is shown in FIG. 1). FIG. 3 is a liquid droplet discharging apparatus equipped with the liquid droplet discharging head of the present invention (as is shown in FIGS. 1 and 2).

In FIGS. 1 and 2, a liquid droplet discharging portion of a liquid droplet discharging head 112 of the present invention is partially shown. In FIG. 3, a liquid droplet discharging apparatus 102 which is equipped with this liquid droplet discharging head 112 is shown.

The liquid droplet discharging head 112 of the present embodiment is formed as an "inkjet recording head" and the liquid droplet discharging apparatus 102 equipped with this liquid droplet discharging head 112 is formed as an inkjet recording apparatus. The liquid droplet discharging apparatus 102 is used for discharging liquid droplets of colored ink (ink droplets) from nozzles 140 of the liquid droplet discharging head 112 onto recording paper P, which is a recording medium, in order to record an image of dots with these liquid droplets.

As shown in FIG. 3, the liquid droplet discharging apparatus 102 is structured to include a carriage 104, a main scanning mechanism 106 and a sub-scanning mechanism 108. The liquid droplet discharging head 112 is mounted at the carriage 104. The main scanning mechanism 106 moves (main scans) the carriage 104 along a recording surface of the recording paper P in a predetermined main scanning direction. The sub-scanning mechanism 108 is for transporting (sub-scanning) the recording paper in a predetermined sub-scanning direction which crosses (preferably perpendicularly intersects) the main scanning direction. In the drawing, the main scanning direction is shown by an arrow M and the sub-scanning direction is shown by an arrow S.

The liquid droplet discharging head 112 is mounted on the carriage 104 such that a nozzle face 114S (see FIG. 2), in which the nozzles 140 (which will be described later) are formed, faces the recording paper P. The liquid droplet discharging head 112 discharges liquid droplets at the recording paper P while being moved in the main scanning direction by the main scanning mechanism 106, and thus carries out recording of an image on a certain band region BE. When one cycle of movement in the main scanning direction finishes, the recording paper P is transported in the sub-scanning direction by the sub-scanning mechanism 108, and the carriage 104 is moved in the main scanning direction again while recording the next band region. Image recording can be carried out over the whole face of the recording paper P by repeating these operations for a plurality of cycles.

As can be seen from FIGS. 1 and 2, the liquid droplet discharging head 112 includes a laminated flow channel plate 114. The laminated flow channel plate 114 is formed by aligning and laminating a total of five plates—a nozzle plate 116, a flow channel plate 118, a supply channel plate 120, a pressure generation chamber plate 122 and an oscillation plate 124—and joining these plates by joining means such as adhesive or the like.

Long holes 126, 128 and 130 are formed along the sub-scanning direction in the pressure generation chamber plate 122, the supply channel plate 120 and the flow channel plate 118. In the state in which the flow channel plate 118, the supply channel plate 120 and the pressure generation chamber plate 122 are laminated, a common flow channel is structured by the long holes 126, 128 and 130.

An ink supply hole 134 is formed in the oscillation plate 124 at a position corresponding with an end portion of the common flow channel. An unillustrated ink supply apparatus is connected with the supply hole 134.

A plurality of flow channels 136 (of which only twelve are shown in FIG. 1) communicating with the long hole 130 are formed along the main scanning direction in the flow channel plate 118. In the state in which the supply channel plate 120, the flow channel plate 118 and the nozzle plate 116 are laminated, liquid can flow in the flow channels 136.

Apertures are formed in the pressure generation chamber plate 122. The apertures structure a plurality of pressure generation chambers 142, which respectively correspond with the flow channels 136. The pressure generation chambers 142 are structured by these apertures and the oscillation plate 124 and supply channel plate 120. Further, piezoelectric devices 144 are attached to the oscillation plate 124 in correspondence with the respective pressure generation chambers 142. A plurality of single plate-type piezoactuators 154 (piezoelectric actuators), which respectively correspond with the pressure generation chambers 142, is structured by the oscillation plate 124 and the piezoelectric devices 144.

Ink supply channels 146 and ink discharge channels 148 are formed in the supply channel plate 120, one each for each of the pressure generation chambers 142, as can be seen in FIG. 1. Further, communication channels 150 and ink discharge apertures 152 are formed in the flow channel plate 118 and the nozzle plate 116, at positions respectively corresponding with the ink discharge channels 148. The nozzles 140 are structured by the ink discharge channels 148, the communication channels 150 and the ink discharge apertures 152. Furthermore, ejectors are structured by the pressure generation chambers 142, the nozzles 140 and the piezoactuators 154.

Hence, as can be seen in the sectional diagram of FIG. 2, an ink communication channel is structured which communicates from the flow channel 136 to the pressure generation chamber 142, the ink discharge channel 148, the communication channel 150 and the ink discharge aperture 152. The ink that is supplied from the unillustrated ink supply apparatus is supplied through the supply hole 134 to the liquid droplet discharging head 112, passes into the common flow channel and from there through the respective flow channels 136, and is charged into the pressure generation chambers 142.

As shown in FIG. 2, the piezoelectric device 144 is structured by a piezoelectric body (layer) 156 and electrode layers 158 and 160, which are provided at both end faces in the thickness direction of the piezoelectric body 156. Here, either one of the electrode layers 158 and 160 is the first electrode layer, and the other is the second electrode layer.

In the liquid droplet discharging head of the present invention, with a view to enabling simpler wiring structures, it is preferable that the electrode layer 160 provided in contact with the oscillation plate 124 is the second electrode layer, and it is preferable that the electrode layer 158 is the first electrode layer. (Below, descriptions will be given with the electrode layer 158 serving as the first electrode layer and the electrode layer 160 serving as the second electrode layer.)

In such a case, wiring is connected such that a side to which higher potential is applied is at the first electrode layer 158, and such that a side to which lower potential is applied is at the second electrode layer 160.

The first electrode layer 158 is structured by a first metallic layer 162 and a second metallic layer 164. The first metallic layer 162 is provided in contact with the piezoelectric body 156 and is formed of a metallic material whose standard electrode potential is greater than 0 V. The second metallic layer 164 is provided in contact with the first metallic layer 162.

The second electrode layer 160 is structured by a metal oxide layer 166 and a third metallic layer 168. The metal oxide layer 166 includes a conductive metal oxide and is provided in contact with the piezoelectric body 156. The third metallic layer 168 is provided in contact with this metal oxide layer 166.

Here, the metal oxide layer 166 may be structured by a non-conductive metal oxide instead of the conductive metal oxide. However, in such a case the third metallic layer 168 alone will function as the second electrode layer 160.

When a driving voltage waveform corresponding to image data is applied to the piezoelectric device 144, the piezoelectric device 144 deforms and the oscillation plate 124 oscillates, causing the pressure generation chamber 142 to expand and contract. As a result, variations in volume of the pressure generation chamber 142 occur, and a pressure wave is generated in the pressure generation chamber 142. Ink in the nozzle 140 (the ink discharge channel 148, the communication channel 150 and the ink discharge aperture 152) is moved by the action of this pressure wave, and a liquid droplet is formed by the ink being discharged outside through the ink discharge aperture 152.

In particular, in the present embodiment, as can be seen in FIGS. 1 and 2, the piezoelectric devices 144 are provided in respective one-to-one correspondence with the pressure generation chambers 142. The piezoelectric devices 144 at the respective pressure generation chambers 142 are made separate and discrete. Therefore, the respective piezoelectric devices 144 are not affected by neighboring piezoelectric devices 144, and can exhibit their respective piezoelectric characteristics.

Furthermore, the first metallic layer 162 is provided in contact with the surface of the piezoelectric body 156 to which surface higher potential is applied. The first metal layer 162 is formed of the metallic material whose standard electrode potential is greater than 0 V. The metal oxide layer 166 is provided at the surface of the piezoelectric body 156 to which surface lower potential is applied. Consequently, even if the piezoelectric device 144 is driven for long periods in a high temperature, high humidity environment, the progress of an electrochemical reaction at the higher potential side of the piezoelectric device 144 can be suppressed, and the accumulation of oxygen holes into lower potential side portions of the piezoelectric body 156 at the lower potential side of the piezoelectric device 144 can be suppressed.

Accordingly, deterioration over time of piezoelectric characteristics of the piezoelectric devices 144 can be suppressed for long periods. Moreover, with the liquid droplet discharging head, stable discharge characteristics and high reliability can continue to be maintained over long periods.

Generally, with a structure in which end faces of a piezoelectric device (in the case of the present embodiment, end faces of the piezoelectric device 144, i.e., end faces of the piezoelectric body 156 and the electrode layers 158 and 160) are exposed, vicinities of these exposed end face portions are susceptible to the occurrence of electrolysis of water and local pH changes. Therefore, with a conventional structure in which a chromium or conductive oxide film, which is electrochemically unstable, is provided, portions of such a metal film or conductive oxide film will be eluted, and there is a risk that discoloration of electrode layers and deterioration of piezoelectric characteristics will occur.

In contrast, with the present embodiment, even though the piezoelectric body 156 and the electrode layers 158 and 160 are exposed, it is possible to suppress discoloration of the electrode layers and deterioration of the piezoelectric characteristics. Further, because, differently from conventional technologies, there is no need to cover cross-sectional surfaces of the piezoelectric body 156 and the electrode layers 158 and 160 in order to prevent the problems mentioned above, the piezoelectric device 144 can be structured at lower cost.

Next, a specific example of a process of production of the piezoelectric device 144 and the liquid droplet discharging head 112 of the present embodiment will be described.

(1) First, the metal oxide layer 166 and the third metallic layer 168 are sequentially, in this order, formed as films on a surface at a side of the piezoelectric body 156 at which the second electrode layer is to be formed. The piezoelectric body 156 is formed of PZT which has been machined to a required thickness.

In a case in which a tin oxide film, for example, is to be formed as the metal oxide layer 166, a tin oxide film as the metal oxide layer 166 may be formed by a sputtering process using a tin oxide target, or formed by a reactive sputtering process using a tin target.

When reactive sputtering is to be performed, oxygen gas may be added to argon gas (with a partial pressure of the oxygen gas relative to total pressure being regulated within a range of, for example, 4 to 40%).

When a tin oxide target is to be sputtered, the sputtering may be performed with small amounts of oxygen being added to argon gas.

Thereafter, the third metallic layer 168 may be formed in a similar manner using a metallic target of Ni, Au or the like, as in the example illustrated below.

(2) Next, the first metallic layer 162 and the second metallic layer 164 are sequentially, in this order, formed as films on the surface at the side of the piezoelectric body 156 at which the first electrode layer is to be formed. The first metallic layer 162 is formed of the metallic material whose standard electrode potential is greater than 0 V.

The first metallic layer 162 may be formed by a sputtering process using a Au target. In order to facilitate the connection of wiring to the first electrode layer 158, the second metallic layer 164 may be formed by forming a Ni layer by a sputtering process using a Ni target and then sequentially layering a Au layer by a sputtering process using a Au target.

(3) A laminated body that has been structured thus is divided up by a blasting process, a dicing process or the like so as to form structures with forms which correspond to the respective pressure generation chambers 142 and in which cross-sectional surfaces of each layer of the laminated body are exposed, and form the piezoelectric devices 144.

(4) The piezoelectric device 144 described above is joined, by means such as adhesion or the like, to the oscillation plate 124 of the laminated flow channel plate 114, into which the plurality of plates have been laminated beforehand. Thus, the piezoactuators 154 are structured by the piezoelectric devices 144 and the oscillation plate 124.

(5) The first electrode layer 158 of the piezoelectric device 144 is connected to a flexible cable via an electrical contact point such as a solder joint or the like.

Thus, the liquid droplet discharging head 112 equipped with the piezoelectric devices 144 relating to the present embodiment is structured. However, processes for production of the piezoelectric devices 144 and the liquid droplet discharging head 112 are not limited thus.

Hereabove, an embodiment of the present invention has been described. This embodiment merely illustrates a preferred embodiment of the present invention, and the present invention is not limited thus. In other words, various modifications, improvements, amendments, simplifications and so forth may be applied to the embodiment described above without departing from the spirit of the present invention.

For example, in the above description, the flow channels are formed by lamination of a plurality of plates to serve as the laminated flow channel plate 114. However, structures, materials and the like of the plates are not limited by the embodiment described above. For example, the flow channels may be integrally molded using a material such as a ceramic, glass, resin, silicon or the like.

Furthermore, the embodiment described above illustrates an example of an inkjet recording head and inkjet recording apparatus which perform recording of text, images and the like by discharging liquid droplets of colored ink (ink droplets) onto recording paper P. However, the liquid droplet discharging head and the liquid droplet discharging apparatus of the present invention are not limited to structures to be used for such inkjet recording, that is, to recording of text and images on recording paper.

Moreover, the recording medium is not necessarily limited to paper and the liquid to be discharged is not necessarily limited to colored ink.

Any object to which liquid droplets are discharged by the liquid droplet discharging head can serve as the recording medium. Similarly, an "image" or "recording image" includes anything which is a pattern of dots on a recording medium obtained by adhering liquid droplets on the recording medium. Thus, while the "recording medium" of course includes recording paper, OHP sheets and the like, it also includes, for example, substrates, glass plates and the like.

Further, the image or recording image does not only mean ordinary images (text, graphics, photographs, etc.) but includes wiring patterns on substrates, three-dimensional objects, organic thin films and so forth. It is also possible to apply the liquid droplet discharging head and liquid droplet discharging apparatus of the present invention to liquid droplet ejection apparatuses in general, which are employed in various industrial applications, such as: production of a color filter for a display, in which colored ink is discharged onto a polymer film or glass; formation of bumps for mounting of components, in which solder in a fused state is discharged onto a substrate; formation of an electroluminescent display panel, in which an organic EL solution is discharged onto a substrate; formation of bumps for electrical mounting, in which solder in the fused state is discharged onto a substrate; and so forth.

Further still, the liquid droplet discharging apparatus described above has a form in which liquid droplet discharging is performed while the liquid droplet discharging head is moved by the carriage. However, it is also possible to apply the present invention to other forms of apparatus, such as using a line-type liquid droplet discharging head in which the ink discharge aperture 152 is provided to extend over the whole width of the recording medium, which line-type head is fixed, and perform recording while only conveying the recording medium (such a case only features main-scanning), or the like.

EXAMPLES

Below, the present invention will be explained in more detail by an Example. The present invention is not limited by the present Example.

For the Example and Comparative Examples described below, a liquid droplet discharging head and liquid droplet discharging apparatus having structures as represented in FIGS. 1 to 3 were produced, and various evaluations were performed.

Example 1

<Production of Piezoelectric Device>

First, a tin oxide layer of 0.2 µm thickness was formed, by reactive sputtering using a tin target, at one face of a plate of PZT with thickness 30 µm. The formation of this tin oxide layer was carried out in conditions in which a flow rate of Ar gas was 20 cm$^3$/min, a flow rate of O$_2$ gas was 5 cm$^3$/min, and total pressure was 4×10$^{-3}$ Pa, with 100 W of electrical power being applied to the tin target (3 inches).

Then, because this tin oxide layer was non-conductive, a Ni layer of 0.6 μm thickness and a Au layer of 0.2 μm thickness were formed on the tin oxide by successive sputtering processes. The Ni layer was formed using a Ni target and the Au layer was formed using a Au target.

Next, a Au layer of 0.2 μm thickness was formed, by sputtering using a Au target, at the other face of the PZT plate. The formation of this Au layer was carried out in conditions in which a flow rate of Ar gas was 25 cm³/min and total pressure was 4×10⁻³ Pa, with 100 W of electrical power being applied to the Au target (3 inches).

Then, in order to assure an electrical contact point, a Ni layer of 0.6 μm thickness and a Au layer of 0.2 μm thickness were formed on the Au layer by successive sputtering processes. The Ni layer was formed using a Ni target and the Au layer was formed using a Au target.

The laminated body in which these respective layers had been thus formed at the two faces of the PZT plate was machined to a predetermined shape by a blasting process to obtain a piezoelectric device 1.

<Production of Liquid Droplet Discharging Head>

Next, the second electrode layer 160 side of the piezoelectric device 1 was adhered and fixed on the oscillation plate 124, as shown in FIGS. 1 and 2, and an upper face of the first electrode layer 158 was connected to a flexible cable, for the application of the higher potentials, by a solder joint. In other respects, the liquid droplet discharging head was produced by performing sequential assembly with conventional methods. This liquid droplet discharging head was a structure in which 360 of the piezoelectric devices were fixedly mounted.

<Evaluation>

Then, the liquid droplet discharging head described above was mounted to a liquid droplet discharging apparatus as shown in FIG. 3 and driven for 3×10⁹ cycles with a driving voltage of 1 kV/mm in a unipolar waveform, in a high temperature, high humidity environment (40° C., 80% RH).

At this time, an electrostatic capacity of each piezoelectric device before commencing the test was established as 100%, and the following three points were evaluated: a smallest value among relative values of electrostatic capacity of each piezoelectric device after testing (electrostatic capacity change (%)); a proportion of the piezoelectric devices in which the electrostatic capacity after testing had fallen by 2% or more relative to the electrostatic capacity before testing (defect incidence rate (%)); and the presence or absence of electrode color changes when portions of the piezoelectric device of the liquid droplet discharging head were inspected with a microscope after testing. Results are shown in FIG. 1.

Comparative Example 1

<Production of Piezoelectric Device>

First, a Au layer of 0.2 μm thickness was formed, by sputtering using a Au target, at one face of a plate of PZT as used in Example 1. The formation of this Au layer was carried out in conditions in which a flow rate of Ar gas was 25 cm³/min and total pressure was 4×10⁻³ Pa, with 100 W of electrical power being applied to the Au target (3 inches).

Next, an iridium oxide layer of 0.2 μm thickness was formed, by reactive sputtering using an Ir target, at the other face of the PZT plate. The formation of this iridium oxide layer was carried out in conditions in which a flow rate of Ar gas was 20 cm³/min, a flow rate of O₂ gas was 5 cm³/min, and total pressure was 4×10⁻³ Pa, with 100 W of electrical power being applied to the Ir target (3 inches).

Then, in order to assure an electrical contact point, a Ni layer and a Au layer were formed on the IrO₂ layer by successive sputtering processes, in the same manner as in Example 1.

The laminated body in which these respective layers had been thus formed at the two faces of the PZT plate was divided up and machined to a predetermined shape by a blasting process to obtain a piezoelectric device 2.

<Production and Evaluation of Liquid Droplet Discharging Apparatus>

Thereafter, a liquid droplet discharging apparatus was produced in the same manner as in Example 1, except that the piezoelectric device 2 was used, and evaluations were performed in the same manner as in Example 1. Results are shown in Table 1.

Comparative Example 2

<Production of Piezoelectric Device>

First, a Au layer of 0.2 μm thickness was formed, by sputtering using a Au target, at one face of a plate of PZT as used in Example 1. The formation of this layer was carried out in conditions in which a flow rate of Ar gas was 25 cm³/min and total pressure was 4×10⁻³ Pa, with 100 W of electrical power being applied to the Au target (3 inches).

Next, a tin oxide layer of 0.2 μm thickness was formed, by reactive sputtering using a tin target, at the other face of the PZT plate. The formation of this tin oxide layer was carried out in conditions in which a flow rate of Ar gas was 20 cm³/min, a flow rate of O₂ gas was 5 cm³/min, and total pressure was 4×10⁻³ Pa, with 100 W of electrical power being applied to the Sn target (3 inches).

Then, in order to assure an electrical contact point, a Ni layer and a Au layer were formed on the SnO₂ layer by successive sputtering processes, in the same manner as in Example 1.

The laminated body in which these respective layers had been thus formed at the two faces of the PZT plate was machined to a predetermined shape by a blasting process to obtain a piezoelectric device 3.

<Production and Evaluation of Liquid Droplet Discharging Apparatus>

Thereafter, a liquid droplet discharging apparatus was produced in the same manner as in Example 1, except that the piezoelectric device 3 was used, and evaluations were performed in the same manner as in Example 1. Results are shown in Table 1.

Comparative Example 3

<Production of Piezoelectric Device>

First, a SnO₂ layer, a Ni layer and a Au layer were formed by successive sputtering processes in this order, in the same manner as in Comparative Example 2, at one face of a plate of PZT as used in Example 1.

Then, a SnO₂ layer, a Ni layer and a Au layer were formed by successive sputtering processes in this order, under the same conditions as in Comparative Example 2, at the other face of the PZT plate. The laminated body in which these respective layers had been thus formed at the two faces of the PZT plate was machined to a predetermined shape by a blasting process to obtain a piezoelectric device 4.

<Production and Evaluation of Liquid Droplet Discharging Apparatus>

Thereafter, a liquid droplet discharging apparatus was produced in the same manner as in Example 1, except that the piezoelectric device 4 was used, and evaluations were performed in the same manner as in Example 1. Results are shown in Table 1.

Comparative Example 4

First, a Cr layer of 0.2 μm thickness was formed, by sputtering using a Cr target, at one face of a plate of PZT as used in Example 1. The formation of this Cr layer was carried out in conditions in which a flow rate of Ar gas was 100 cm$^3$/min and total pressure was 4×10$^{-3}$ Pa, with 500 W of electrical power being applied to the Cr target (8 inches). Then, a Au layer of 0.01 μm thickness was formed on this Cr layer by sputtering using a Au target.

Next, a Cr layer of 0.2 μm thickness was formed, by sputtering using a Cr target, at the other face of the PZT plate. The formation of this Cr layer was carried out in conditions in which a flow rate of Ar gas was 100 cm$^3$/min and total pressure was 4×10$^{-3}$ Pa, with 500 W of electrical power being applied to the Cr target (8 inches).

Then, in order to assure an electrical contact point, a Ni layer and a Au layer were formed on the Cr layer by successive sputtering processes, in the same manner as in Example 1.

The laminated body in which these respective layers had been thus formed at the two faces of the PZT plate was machined to a predetermined shape by a blasting process to obtain a piezoelectric device 5.

<Production and Evaluation of Liquid Droplet Discharging Apparatus>

Thereafter, a liquid droplet discharging apparatus was produced in the same manner as in Example 1, except that the piezoelectric device 5 was used, and evaluations were performed in the same manner as in Example 1. Results are shown in Table 1.

TABLE 1

| | Layer structure of piezoelectric device First electrode layer side/Piezoelectric body layer (PZT)/ Second electrode layer side | Results of evaluation | | | |
|---|---|---|---|---|---|
| | | Color change? (Y/N) | Electrostatic capacity change (%) | | Defect incidence rate (%) |
| | | | Before test | After Test | |
| Example 1 | Au/Ni/Au/PZT/SnO$_2$/Ni/Au | N | 100 | 97 | 1 |
| Comparative Example 1 | Au/Ni/IrO$_2$/PZT/Au | N | 100 | 65 | 15 |
| Comparative Example 2 | Au/Ni/SnO$_2$/PZT/Au | N | 100 | 60 | 80 |
| Comparative Example 3 | Au/Ni/SnO$_2$/PZT/SnO$_2$/Ni/Au | N | 100 | 65 | 15 |
| Comparative Example 4 | Au/Ni/Cr/PZT/Cr/Au | Y | 100 | 40 | 30 |

As can be seen from table 1, in Example 1, discoloration of the piezoelectric device after testing was not observed, a reduction in electrostatic capacity after driving for a long time was slight, and the defect incidence rate of the piezoelectric devices was approximately 1%, which is quite low. Thus, it was found that Example 1 had little deterioration of piezoelectric characteristics and high reliability, even in high temperature and high humidity.

In contrast, in Comparative Examples 1 to 4, reductions in electrostatic capacity were large and defect incidence rates of the piezoelectric devices were large, being in the 10 to 20% range or greater. Moreover, in Comparative Example 4, discoloring of the piezoelectric devices was confirmed. In other words, it was found that deteriorations of piezoelectric characteristics were significant and reliabilities were strikingly low in high temperature and high humidity.

According to the present invention as described above, it is possible to provide a high-reliability piezoelectric device, a liquid droplet discharging head using this device and a liquid droplet discharging apparatus using the liquid droplet discharging head, with which, even if the liquid droplet discharging head is continuously used over long periods in high temperatures and high humidities, deterioration over time of piezoelectric characteristics of the piezoelectric device of the liquid droplet discharging head can be avoided.

What is claimed is:

1. A piezoelectric device including: a piezoelectric body layer; a first electrode layer disposed at a side of one face of the piezoelectric body layer, at which first electrode layer a higher potential is to be applied; and a second electrode layer disposed at a side of a face of the piezoelectric body layer that is opposite to the side thereof at which the first electrode layer is disposed, at which second electrode layer a lower potential is to be applied, the piezoelectric device comprising:
a metallic layer disposed in contact with the face of the piezoelectric body layer at the side thereof at which the first electrode layer is disposed, the metallic layer being formed of a metallic material with a standard electrode potential greater than 0 V; and
a metal oxide layer disposed in contact with the face of the piezoelectric body layer at the side thereof at which the second electrode layer is disposed, the metal oxide layer being formed of a metal oxide.

2. The piezoelectric device of claim 1, wherein the metallic material comprises at least one metallic element selected from the group consisting of Ir, Au, Pt, Ru, Pd, Rh, Re, Ag and Cu.

3. The piezoelectric device of claim 1, wherein the metallic layer comprises a thickness in the range of 50 nm to 1 μm.

4. The piezoelectric device of claim 1, wherein the metal oxide comprises at least one metallic element selected from the group consisting of Ir, Sn, Ru, Re, Rh, Pd, Sr, In, Ti, Zr, Nb, Mg, Si, Ta, Al, Zn, Mn, Co, Os and Hf.

5. The piezoelectric device of claim 1, wherein the metal oxide layer comprises a thickness in the range of 50 nm to 1 μm.

6. The piezoelectric device of claim 1, wherein the first electrode layer has a structure formed of three layer which include the metal layer, in which structure the metallic layer, a layer containing Ni and a layer containing Au are laminated in this order from the piezoelectric body layer side.

7. The piezoelectric device of claim 1, wherein the piezoelectric device comprises an end face, and at least a portion of the end face is exposed.

8. A liquid droplet discharging head comprising:
a pressure generation chamber which is filled with liquid;
a nozzle which is in fluid communication with the pressure generation chamber and which is capable of discharging a liquid droplet; and
an actuator which includes at least
an oscillating diaphragm which structures at least a portion of a wall face of the pressure generation chamber and which, by oscillating, causes the pressure generation chamber to expand and contract, and a piezoelectric device which, by deforming in accordance with voltages which are applied in accordance with image information, causes the oscillating diaphragm to oscillate, the piezoelectric device including at least:

a piezoelectric body layer;

a first electrode layer disposed at a side of one face of the piezoelectric body layer, at which first electrode layer a higher potential is to be applied; and a second electrode layer disposed at a side of a face of the piezoelectric body layer that is opposite to the side thereof at which the first electrode layer is disposed, at which second electrode layer a lower potential is to be applied, wherein a metallic layer is disposed in contact with the face of the piezoelectric body layer at the side thereof at which the first electrode layer is disposed, the metallic layer being formed of a metallic material with a standard electrode potential greater than 0 V, and a metal oxide layer is disposed in contact with the face of the piezoelectric body layer at the side thereof at which the second electrode layer is disposed, the metal oxide layer being formed of a metal oxide.

9. The liquid droplet discharging head of claim 8, wherein the metallic material comprises at least one metallic element selected from the group consisting of Ir, Au, Pt, Ru, Pd, Rh, Re, Ag and Cu.

10. The liquid droplet discharging head of claim 8, wherein the metallic layer comprises a thickness in the range of 50 nm to 1 μm.

11. The liquid droplet discharging head of claim 8, wherein the metal oxide comprises at least one metallic element selected from the group consisting of Ir, Sn, Ru, Re, Rh, Pd, Sr, In, Ti, Zr, Nb, Mg, Si, Ta, Al, Zn, Mn, Co, Os and Hf.

12. The liquid droplet discharging head of claim 8, wherein the metal oxide layer comprises a thickness in the range of 50 nm to 1 μm.

13. The liquid droplet discharging head of claim 8, wherein the first electrode layer comprises a structure formed of three layers which includes the metallic layer, in which structure the metallic layer, a layer including Ni and a layer including Au are laminated in this order from the piezoelectric body layer side.

14. The liquid droplet discharging head of claim 8, wherein the piezoelectric device comprises an end face, and at least a portion of the end face is exposed.

15. The liquid droplet discharging head of claim 8, wherein a face of the piezoelectric device, at the side thereof at which the second electrode is provided, is disposed in contact with the oscillating diaphragm.

16. A liquid droplet discharging apparatus at least including a liquid droplet discharging head, the liquid droplet discharging head comprising:

a pressure generation chamber which is filled with liquid;

a nozzle which is in fluid communication with the pressure generation chamber and which is capable of discharging a liquid droplet; and an actuator which includes at least an oscillating diaphragm which structures at least a portion of a wall face of the pressure generation chamber and which, by oscillating, causes the pressure generation chamber to expand and contract, and a piezoelectric device which, by deforming in accordance with voltages which are applied in accordance with image information, causes the oscillating diaphragm to oscillate, the piezoelectric device including at least:

a piezoelectric body layer;

a first electrode layer disposed at a side of one face of the piezoelectric body layer, at which first electrode layer a higher potential is to be applied; and a second electrode layer disposed at a side of a face of the piezoelectric body layer that is opposite to the side thereof at which the first electrode layer is disposed, at which second electrode layer a lower potential is to be applied, wherein a metallic layer, which is formed of a metallic material with a standard electrode potential greater than 0 V, is provided in contact with the face of the piezoelectric body layer at the side thereof at which the first electrode layer is disposed, and a metal oxide layer, which is formed of a metal oxide, is provided in contact with the face of the piezoelectric body layer at the side thereof at which the second electrode layer is disposed.

* * * * *